United States Patent
Bhagat et al.

(10) Patent No.: US 7,761,078 B2
(45) Date of Patent: Jul. 20, 2010

(54) DUAL INDUCTOR CIRCUIT FOR MULTI-BAND WIRELESS COMMUNICATION DEVICE

(75) Inventors: Maulin Pareshbhai Bhagat, San Diego, CA (US); John Woolfrey, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 723 days.

(21) Appl. No.: 11/675,274

(22) Filed: Feb. 15, 2007

(65) Prior Publication Data

US 2008/0024349 A1 Jan. 31, 2008

Related U.S. Application Data

(60) Provisional application No. 60/834,129, filed on Jul. 28, 2006.

(51) Int. Cl.
*H04B 1/28* (2006.01)
(52) U.S. Cl. .................. 455/333; 455/334; 455/552.1; 341/155; 336/200
(58) Field of Classification Search ............... 455/323, 455/333, 334, 550.1, 552.1; 341/155; 336/200, 336/223
See application file for complete search history.

(56) References Cited

U.S. PATENT DOCUMENTS

| | | | |
|---|---|---|---|
| 6,798,326 B2 * | 9/2004 | Iida | 336/200 |
| 6,867,677 B2 * | 3/2005 | Nielson | 336/200 |
| 6,876,840 B2 * | 4/2005 | Shin et al. | 455/280 |
| 6,975,841 B2 * | 12/2005 | Uriu et al. | 455/78 |
| 6,993,313 B2 | 1/2006 | Castillejo et al. | |
| 7,057,488 B2 | 6/2006 | Van Haaren et al. | |
| 2005/0052272 A1 | 3/2005 | Tiebout | |
| 2005/0156774 A1 * | 7/2005 | Li et al. | 341/155 |
| 2006/0181386 A1 * | 8/2006 | Lee et al. | 336/200 |

FOREIGN PATENT DOCUMENTS

WO 2007/006867 1/2007

OTHER PUBLICATIONS

International Search Report, PCT/US07/074718—International Search Authority, European Patent Office, Dec. 21, 2007.
Written Opinion, PCT/US07/074718—International Search Authority, European Patent Office, Dec. 21, 2007.

* cited by examiner

*Primary Examiner*—Nhan Le
(74) *Attorney, Agent, or Firm*—Jianyu Xu

(57) ABSTRACT

This disclosure describes a dual inductor circuit, which may be particularly useful in a mixer of a wireless communication device to allow the mixer to operate for two different frequency bands. The dual inductor circuit comprises an inductor-within-inductor design in which a small inductor is disposed within a large inductor. The two inductors may share a ground terminal, but are otherwise physically separated and independent from one another. Terminals of the inner inductor, for example, are not tapped from the outer inductor, which can reduce parasitic effects and electromagnetic interference relative to tapped inductor designs. The independence of the inductors also allows the different inductors to define different resonance frequencies, which is desirable.

25 Claims, 7 Drawing Sheets

DUAL INDUCTOR CIRCUIT FOR MULTI-BAND WIRELESS COMMUNICATION DEVICE

This application claims the benefit of U.S. Provisional Application No. 60/834,129, filed Jul. 28, 2006, the entire content of which is incorporated herein by reference.

FIELD

This disclosure relates to inductors that can be implemented within wireless communication devices, and more particularly on-chip inductor circuits used in wireless communication devices.

BACKGROUND

Inductors are common electrical circuit elements implemented within wireless communication devices and a wide range of other electronic devices. Although inductors are very useful and desirable, they are often one of the most space-consuming elements of a radio frequency integrated circuit (RFIC). In an RFIC, inductors are commonly used within amplifier elements of the RFIC component commonly referred to as the "mixer." A mixer generally refers to the portion of an RFIC which generates (i.e., mixes) a baseband signal from a received carrier waveform. Mixers are also used on the transmitter side, e.g., to modulate a baseband signal onto a carrier.

On the receiver side, the mixer receives a waveform, which typically includes a carrier wave modulated with a baseband data signal. The mixer may include an amplifier element to properly tune the received waveform. The mixer synthesizes a copy of the carrier wave, e.g., using a local oscillator (LO) of the device. The mixer then removes the baseband signal from the received waveform by essentially subtracting the carrier wave generated by the LO from the received waveform. Once removed from the carrier, the baseband signal can then be converted into digital samples and demodulated, e.g., by a digital circuit.

An inductor may be used within the amplifier element of the mixer in order to set the performance of the mixer to a particular operating frequency. Some wireless communication devices support multiple frequency bands, in which case, multiple mixers are typically needed. Moreover, each mixer requires its own inductor to set its performance at the operation frequency associated with the respective mixer. The use of several different mixers to support multiple frequency bands is undesirable, particularly due to the space consumption that would be required within the RFIC to accommodate the different inductors.

SUMMARY

In general, this disclosure describes a dual inductor circuit, which may be particularly useful in a mixer of a wireless communication device to allow the mixer to operate for different frequency bands. The dual inductor circuit comprises an inductor-within-inductor design in which a small inductor is disposed within a large inductor. The two inductors may share a ground terminal, but are otherwise physically separated and independent from one another. Terminals of the inner inductor, for example, are not tapped from the outer inductor, which can reduce parasitic effects and electromagnetic interference relative to tapped inductor designs. The independence of the inductors also allows the different inductors to define different resonance frequencies, which is highly desirable.

In one aspect, this disclosure provides a multi-band wireless communication device comprising a mixer that mixes baseband signals from received signals. The mixer comprises a dual inductor circuit including a first inductor defining a first terminal and a second terminal, wherein the first inductor coils from the first and second terminals to a ground terminal. The dual inductor circuit also includes a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

In another aspect, this disclosure provides a dual inductor circuit comprising a first inductor defining a first terminal and a second terminal, wherein the first inductor coils from the first and second terminals to a ground terminal, and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

In another aspect, this disclosure provides a method comprising mixing received wireless signals to baseband signals using a selected inductor of a dual inductor circuit in a wireless communication device, the dual inductor circuit including a first inductor defining a first terminal and a second terminal, wherein the first inductor coils from the first and second terminals to a ground terminal, and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

In an added example, this disclosure provides a multi-band wireless communication device comprising a mixer that mixes baseband signals onto a carrier. The mixer comprises a dual inductor circuit including a first inductor defining a first terminal and a second terminal, wherein the first inductor coils from the first and second terminals to a ground terminal, and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

Additional details of various examples are set forth in the accompanying drawings and the description below. Other features, objects and advantages will become apparent from the description and drawings, and from the claims.

DETAILED DESCRIPTION

This disclosure describes a dual inductor circuit, which may be particularly useful in a mixer of a wireless communication device to allow the mixer to operate for two different frequency bands. The dual inductor circuit comprises an inductor-within-inductor design in which a small inductor is disposed within a large inductor. The two inductors may share a ground terminal, but are otherwise physically separated and independent from one another. Terminals of the inner inductor, for example, are not tapped from the outer inductor, and this can reduce parasitic effects and electromagnetic interference relative to tapped inductor designs. The respective independence of the inductors also allows the different inductors to define different resonance frequencies, which is desirable.

The maximum interference between both inductors occurs at either inductor's self resonant frequency. A tapped inductor's self resonant frequency, however, is determined by the entire structure and not individual inductor coils. In an application using a tapped inductor, it is possible that the self resonant frequency of the structure may occur near the desired operating frequency of the inner coil. In such a case, performance of the circuit using the inner coil can be drastically impacted.

In contrast to a tapped inductor design, the inductor-inside-inductor topology described herein may have two independent self resonant frequencies, one for each independent inductor coil. The outer inductor coil can have a lower self resonant frequency than the inner inductor coil, and for some applications it is possible this resonant frequency can approach the desired operating frequency of the inner inductor coil. In such a situation, impact to performance of the circuit using the inner inductor coil can be minimized due to isolation between the two different inductor coils. Therefore, due to low coupling between both inner and outer coils, two separate self resonant frequencies can exist, which can make the inductor-inside-inductor more desirable and can reduce or eliminate any negative impact on the performance of the inner inductor coil.

Figure 1:
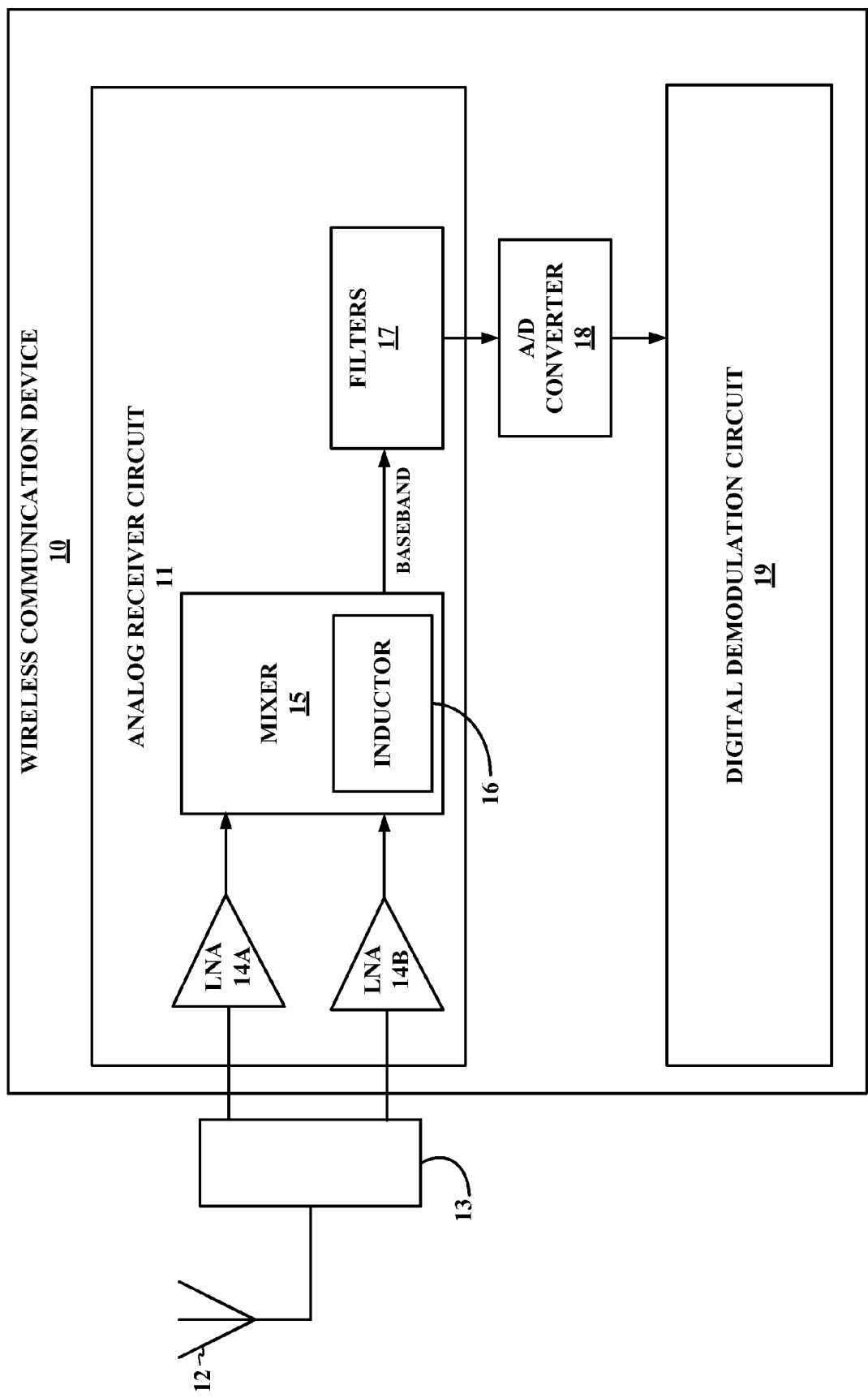
FIG. 1 is a block diagram of a multi-band wireless communication device according to an example of this disclosure.

FIG. 1 is a block diagram of a multi-band wireless communication device 10 according to an example of this disclosure. The block diagram of FIG. 1 is simplified for purposes of explanation of the dual inductor circuit of this disclosure. Many other components (not illustrated) may also be used in device 10. Device 10 may comprise a cellular or satellite radiotelephone, a radiotelephone base station, a computer that supports one or more wireless networking standards, a wireless access point for wireless networking, a PCMCIA card incorporated within a portable computer, a direct two-way communication device, a personal digital assistant (PDA) equipped with wireless communication capabilities, and the like. These and many other types of devices may use the dual inductor circuit designs described herein.

Device 10 may implement one or more of a wide variety of wireless communication standards or techniques. Examples of wireless communication techniques include frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum signal. Furthermore, some wireless standards make use of two or more techniques, such as GSM systems, which use a combination of TDMA and FDMA modulation. GSM stands for "Global System for Mobile Communications." A number of wireless networking standards, and other wireless communication standards and techniques have also been developed, including several IEEE 802.11 standards, Bluetooth standards, and emerging ultra-wideband (UWB) techniques and standards.

Device 10 may be referred to as "multi-band" insofar as it supports wireless communication in two or more wireless frequency bands. As an example, device 10 may support CDMA or GSM wireless communication in one frequency band, e.g., around 2.4 gigahertz (GHz), and may also support legacy analog wireless communication in another frequency band, e.g., around 800 megahertz (MHz). As another example, device 10 may support CDMA and/or GSM wireless communications in two different frequency bands, e.g., around 1.8 GHz and 2.4 GHz, respectively. The dual inductor circuit designs described herein may help to support any two frequency bands, and may be used with a wide variety of wireless communications. The frequency bands and standards listed herein are merely exemplary.

Device 10 may comprise an analog receiver circuit 11 and a digital demodulation circuit 19. Analog receiver circuit 11 may comprise a so-called radio frequency integrated circuit (RFIC). Digital demodulation circuit 19 may comprise a digital modem (modulation-demodulator). Circuits 11 may be fabricated on separate chips or a common chip.

As illustrated, device 10 includes an antenna 12 that receives wireless signals. The wireless signals may be separated into different paths by signal path separation circuit 13. Thus, the dual band design allows a single antenna to receive two different signal frequencies, although in other cases, separate antennas could be used to receive the different signals at the different frequencies. In FIG. 1, for each signal path, the respective signal is scaled by a low noise amplifier (LNA) 14A or 14B and delivered to mixer 15. Mixer 15 makes use of a dual inductor circuit 16, as described herein, to allow the mixer to handle two or more different frequency bands. In particular, dual inductor circuit 16 may be implemented within an amplifier (not shown in FIG. 1) of mixer 15. The amplifier of mixer 15 scales the wireless signals from a respective one of LNAs 14A or 14B and then mixes the signal to baseband.

The received wireless signal may comprise a carrier waveform modulated with a baseband signal. Mixer 15 removes the baseband signal from the carrier of the received signal so that sampling and demodulation can be performed on the baseband signal. In particular, mixer 15 may receive a reference waveform produced by a local oscillator (not shown) of device 10. Mixer 15 subtracts the reference waveform from the received wireless signal to remove the carrier and produce the baseband signal. The baseband signal is then filtered by one or more filters 17. An analog-to-digital (A/D) converter 18 converts the baseband signal into digital baseband samples, which are forwarded to a digital demodulation circuit 19 for demodulation.

Mixer 15 is a dual band mixer in that it supports two different frequency bands, e.g., a first signal in a first frequency band from LNA 14A and a second signal in a second frequency band from LNA 14B. Device 10 may operate in two different modes, which support wireless communication at the two different frequency bands. These two modes may comprise an analog and digital mode, two different digital modes, or possibly two different analog modes. Dual inductor circuit 16 includes two different independent inductors. One of the inductors (a smaller coil) is disposed inside the other inductor (a larger coil). In this manner, dual inductor circuit 16 provides the ability to support two different frequency bands, yet achieves a relatively compact and efficient two-dimensional circuit design.

Dual inductor circuit 16 may have reduced parasitics and electromagnetic interference relative to inductor circuits that employ a tapped inductor configuration. The two inductors of dual inductor circuit 16 may share a ground terminal, but are otherwise physically separated and independent from one another. Unlike tapped inductor configurations, for example, terminals of the inner inductor of circuit 16 are not tapped from the outer inductor. This also allows the two inductors of dual inductor circuit 16 to define different resonance frequencies.

The details of this disclosure primarily refer to a mixer on the receiver side, e.g., that mixes baseband signals from a received signal. However, this disclosure also contemplates the use of the described dual inductor circuits in mixers on the transmitter side, e.g., that modulates a carrier with a baseband signal. Moreover, many other devices, including devices unrelated to wireless communication could implement the disclosed dual inductor circuits outlined in greater detail below.

Figure 2:
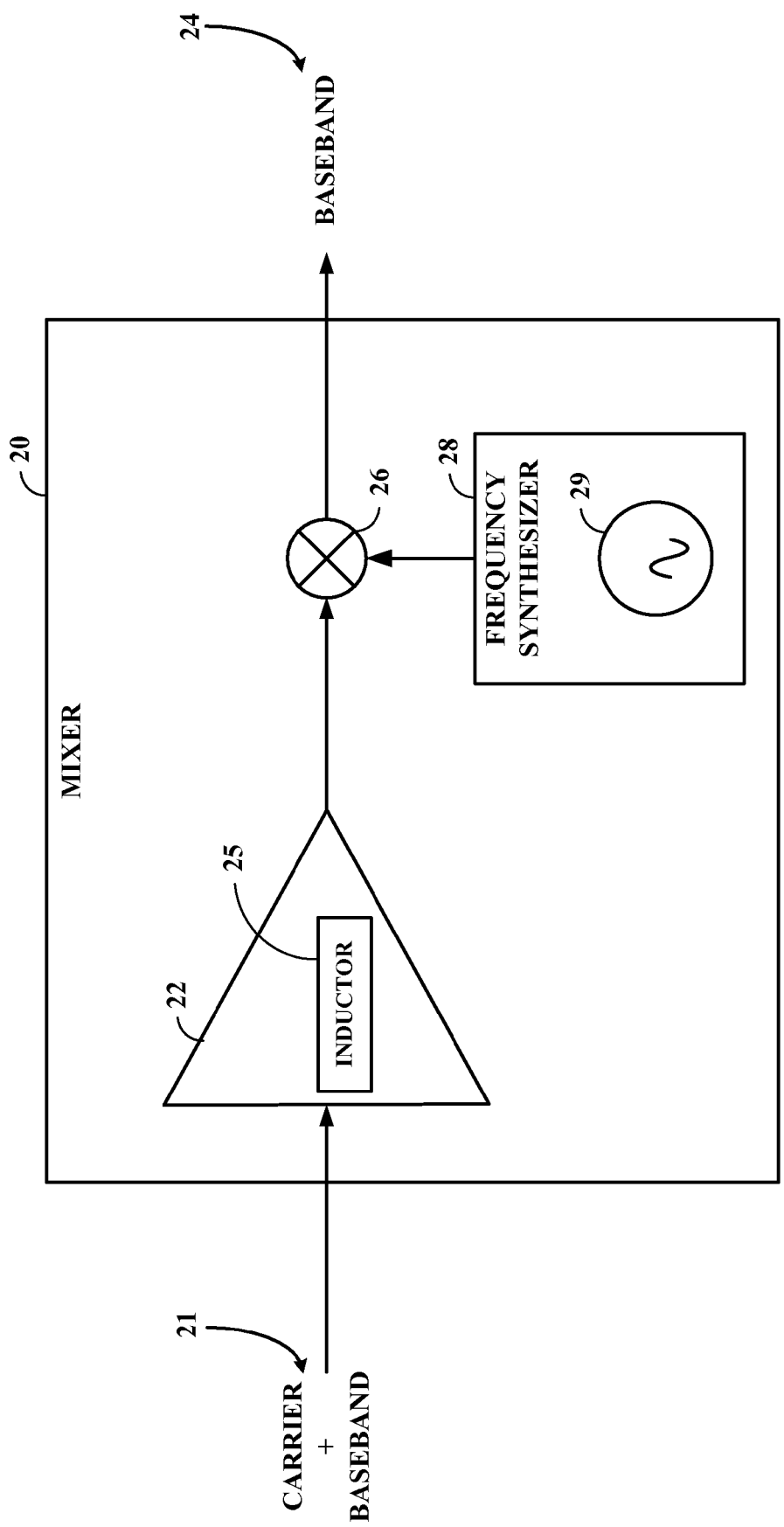
FIG. 2 is a block diagram of a mixer suitable for incorporation in the wireless communication device of FIG. 1 according to an example of this disclosure.

FIG. 2 is a block diagram of a mixer 20 according to an example of this disclosure, which may correspond to mixer 15 of FIG. 1. As shown, mixer 20 receives a wireless signal 21 that comprises a baseband signal modulated on a carrier wave. Amplifier 22 is a tuning element that conditions wireless signal 21 for mixing. Amplifier 22 includes a dual inductor circuit 25, as described in this disclosure, in order to allow mixer 20 to handle signals at two different frequency bands. A mode may be selected, and based on the selected mode, dual inductor circuit 25 may be set accordingly.

Mixing switcher 26 receives the wireless signal that is properly scaled by amplifier 22. Mixer switcher 26 also receives a reference waveform from frequency synthesizer 28. Frequency synthesizer 28 may access a local oscillator (LO) 29 to generate the reference waveform at the expected frequency. In order to support two different frequencies, frequency synthesizer 28 may implement adding techniques, subtracting techniques, feed forward techniques, feed back techniques, or the like, to generate signals at different desired frequencies. Alternatively, two different LO's could be used.

In any case, once a proper reference waveform is provided by frequency synthesizer 28, mixer switcher 26 subtracts the reference waveform from the tuned wireless signal, which includes the carrier and the baseband signal. In this manner, mixer 20 removes the carrier to generate baseband signal 24. Baseband signal 24 can then be processed, possibly converted to digital samples, and then demodulated. In some cases, however, the demodulation could be done in an analog domain, particularly for legacy analog wireless formats or standards.

As described herein, mixer 20 supports at least two different frequency bands. In order to achieve such dual mode functionality in an efficient manner, this disclosure provides dual inductor circuit 25. As described in greater detail below, dual inductor circuit 25 comprises an inductor-within-inductor design in which a relatively small inductor is disposed within a relatively large inductor. Again, the two inductors may share a ground terminal, but are otherwise physically separated and independent from one another. Terminals of the inner inductor, for example, are not tapped from the outer inductor, and this design can reduce parasitic effects and electromagnetic interference relative to tapped inductor designs. This also allows the different inductors of dual inductor circuit 25 to define different self resonance frequencies.

Figure 3:
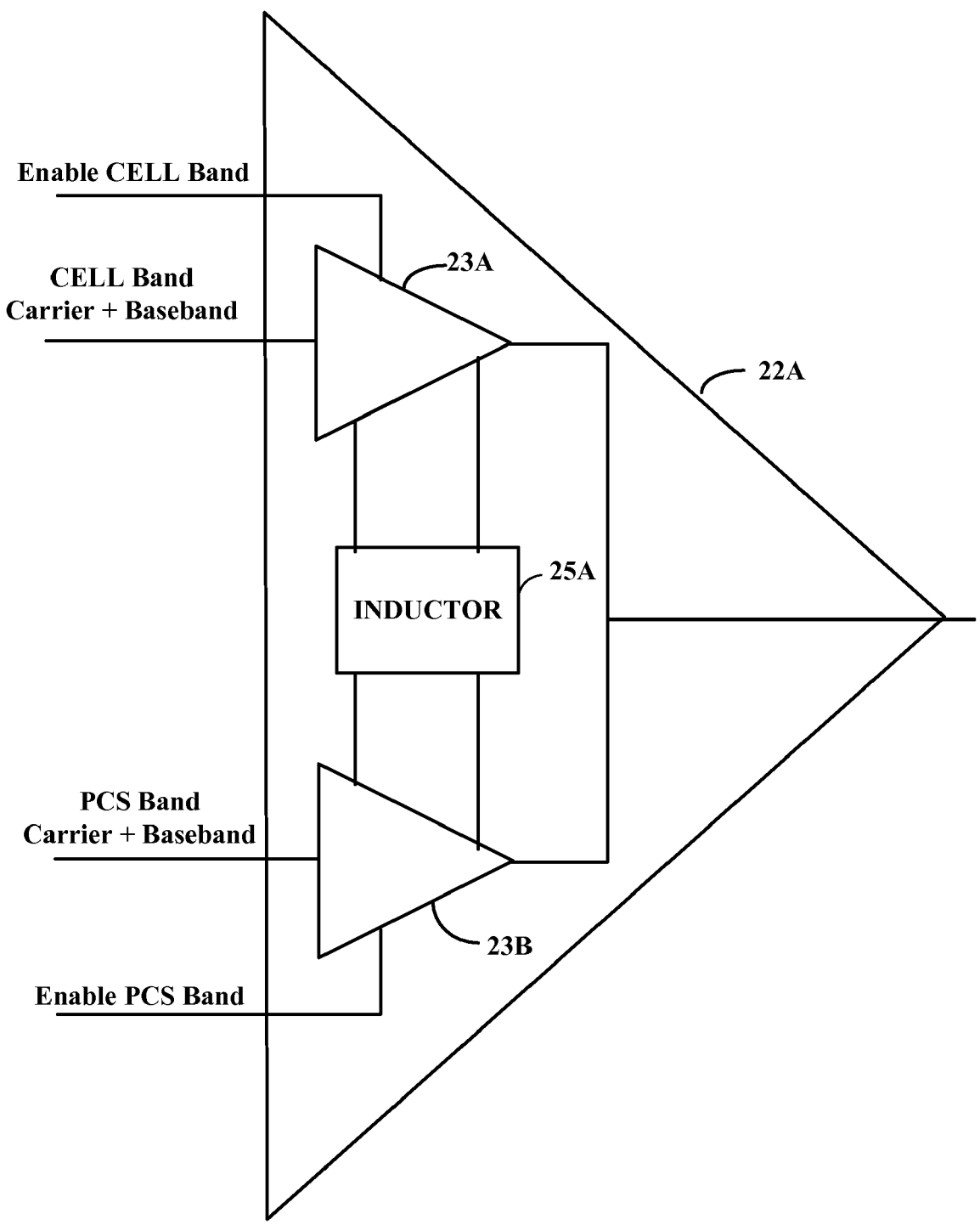
FIG. 3 is a more detailed example of one amplifier design that may use an inductor circuit of this disclosure.

FIG. 3 is a more detailed example of one example of an amplifier 22A that may use an inductor circuit of this disclosure. Amplifier 22A may correspond to amplifier 22 of FIG. 2. Amplifier 22A itself includes two different amplifier circuits 23A and 23B, which operate with respect to the different frequency bands. In particular, amplifier circuit 23A may be used to scale signals in a cellular band and amplifier circuit 23B may be used to scale signals in a PCS band. Importantly, however, each of amplifier circuits 23A and 23B couple to a common inductor circuit 25A. Inductor circuit 25A employs an inductor-within-inductor design, as describe herein. An outer coil of inductor circuit 25A may be used to accommodate cellular band signals scaled by amplifier circuit 23A and an inner coil of inductor circuit 25A may be used to accommodate PCS signals scaled by amplifier circuit 23B.

Each duplicate amplifier circuit 23A and 23B is connected to the appropriate inductor terminals of inductor circuit 25A. The outputs of each duplicate amplifier circuit 23A and 23B are connected together before entering the mixer switcher 26 (FIG. 2). Control signals ("Enable CELL Band" and "Enable PCS Band") may be used to select the appropriate amplifier at any given time. Enabling the cell band will disable the PCS band, and enabling the PCS band will disable the cell band.

Figure 4:
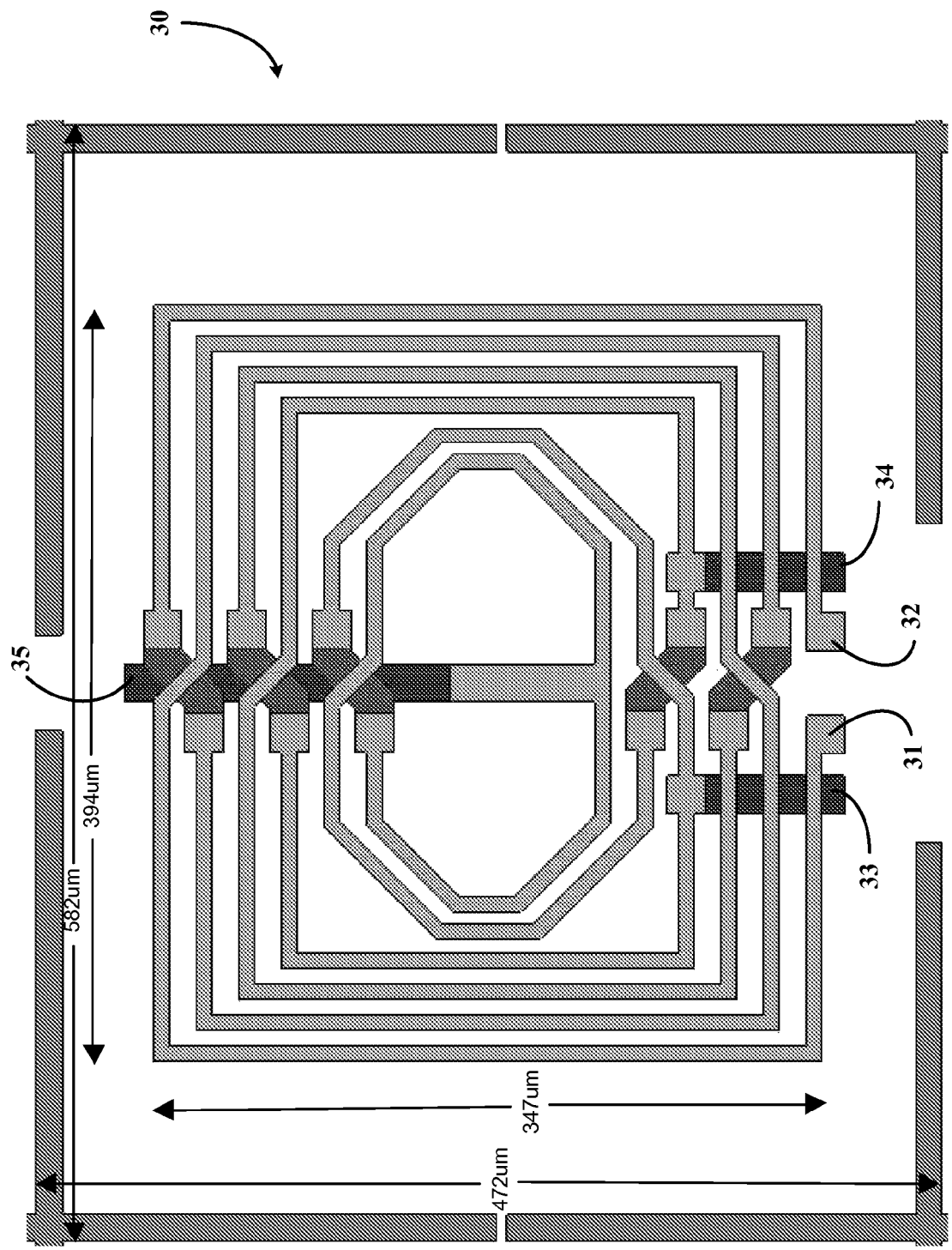
FIG. 4 is a circuit layout diagram of an inductor circuit that implements a tapped configuration in which a small inner inductor is tapped from a larger inductor.

FIG. 4 is a circuit layout diagram of an inductor circuit 30 that implements a tapped configuration in which a small inner inductor is tapped from a larger inductor. Inductor circuit 30 is less desirable than the other inductor circuits described herein because it uses one large coil from terminals 31 and 32 to ground terminal 35. A smaller inductor is created by tapping into the large inductor at an intermediate location, i.e. via terminals 33 and 34. The small inductor that extends beyond these intermediate taps at terminals 33 and 34, however, adds substantial parasitic capacitance effects and interference, which can substantially degrade the performance of inductor circuit 30. In addition, because the smaller inductor is tapped from the larger inductor, the different inductors of inductor circuit 30 typically have the same resonance frequency. The inductor designs shown in FIGS. 5 and 6 may overcome these or other shortcomings of the inductor circuit 30 of FIG. 4. Exemplary dimensions of inductor circuit 30 are labeled.

Figure 5:
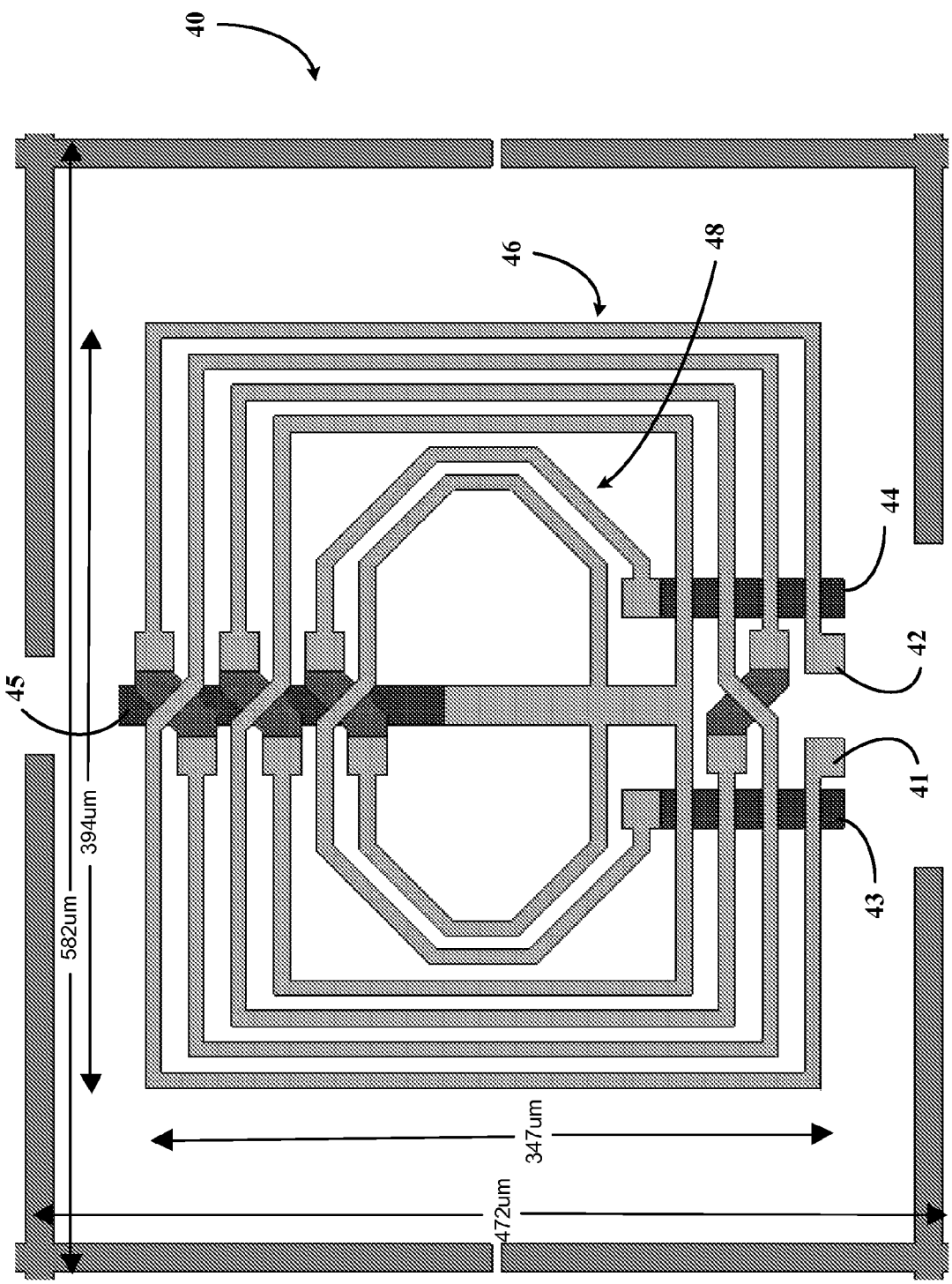
FIGS. 5 and 6 are exemplary circuit layout diagrams of dual inductor circuits that comprise an inductor independently disposed within larger inductor according to examples of this disclosure.
Figure 6:
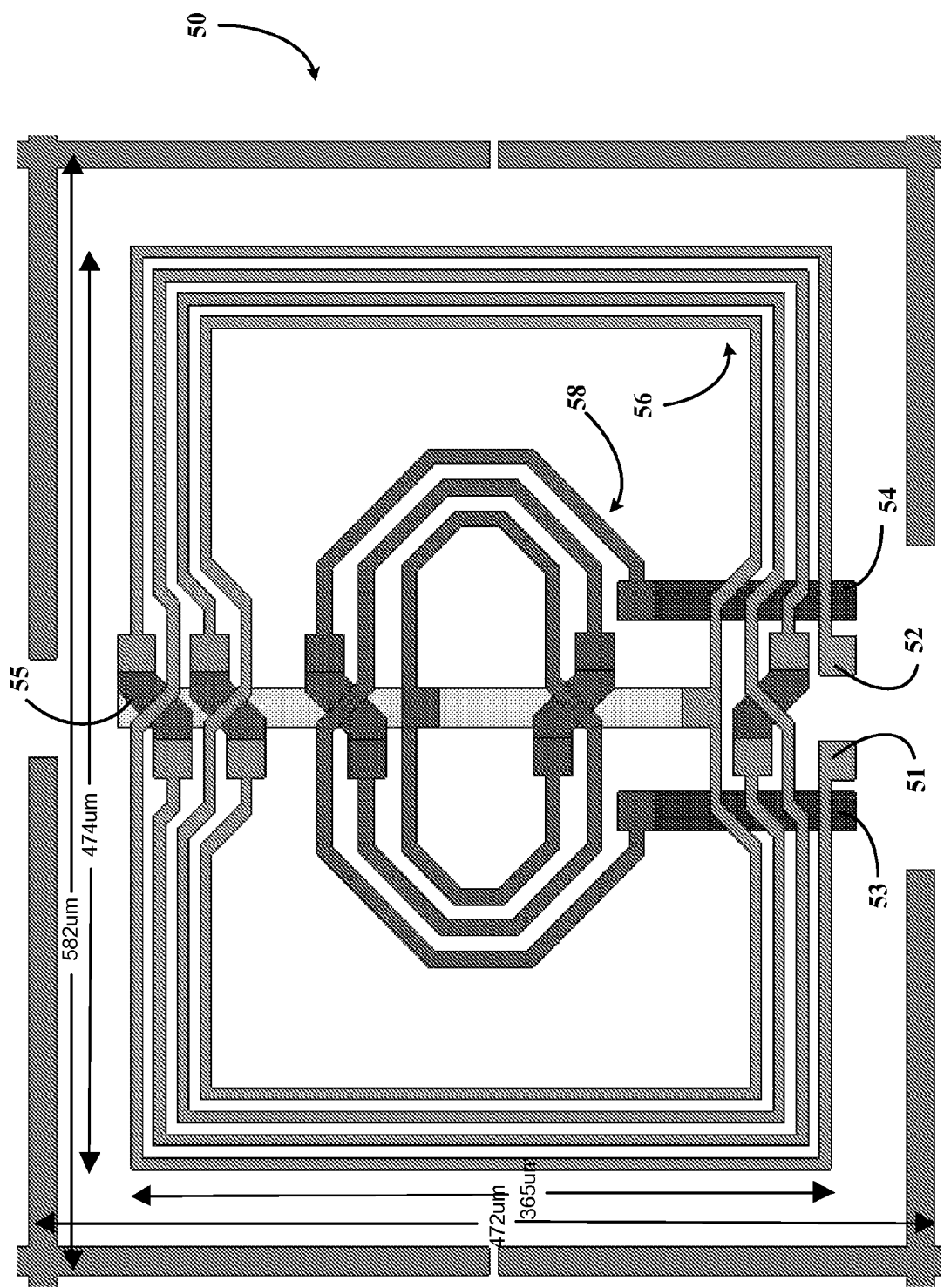

FIGS. 5 and 6 are exemplary circuit layout diagrams of dual inductor circuits 40 and 50 that comprise an inductor independently disposed within larger inductor, according to examples of this disclosure. Dual inductor circuits 40 and 50 may correspond to either of inductor circuits 16 or 25 of FIGS. 1 and 2, or could be used in another type of device. Unlike inductor circuit 30 in which the inner and outer inductors would have a common resonance frequency, the resonance frequency of the different inductors of dual inductor circuits 40 and 50 can be defined differently since the coils are independent. This is highly desirable.

In particular, in contrast to a tapped inductor design, the inductor-inside-inductor topology shown in FIGS. 5 and 6 may have two independent self resonant frequencies, one for each independent inductor coil. The outer inductor coil can have a lower self resonant frequency than the inner inductor coil, and for some applications it is possible this resonant frequency can approach the desired operating frequency of the inner inductor coil. In such a situation, impact to performance of the circuit using the inner inductor coil can be minimized due to isolation between the two different inductor coils. Therefore, due to low coupling between both inner and outer coils, two separate self resonant frequencies can exist, which can make the inductor-inside-inductor more desirable and cause less negative impact on the performance of the inner inductor coil.

As shown in FIG. 5, dual inductor circuit 40 comprises a first inductor 46 and a second inductor 48. The second inductor 48 is disposed inside first inductor 46. Both inductors 46 and 48 comprise coils that coil in a two-dimensional fashion. In this manner, circuit 40 defines an inductor-within-inductor design in which a small inductor coil (second inductor 48) is disposed within a large inductor coil (first inductor 46). For purposes of illustration, dimensions of dual inductor circuit 40 are shown in FIG. 5. However, examples of this disclosure are not necessarily limited to the sizes or shapes of the coils shown in FIG. 5.

First inductor 46 defines a first terminal 41 and a second terminal 42. First inductor 46 coils from the first and second terminals 41 and 42 to a ground terminal 45. Second inductor 48 is disposed inside first inductor 46, but is independent from first inductor 46 and is not tapped from first inductor 46. In this manner, dual inductor circuit 40 is different from inductor circuit 30 of FIG. 4, which employs a tapped configuration. In dual inductor circuit 40, second inductor 48 defines a third terminal 43 and a fourth terminal 44. Second inductor 48 coils from third and fourth terminals 43 and 44 to ground terminal 45. Again, however, third and fourth terminals 43 and 44 of the second inductor 48 are independent from the first inductor 46 insofar as third and fourth terminals 43 and 44 are not tapped from first inductor 46. First inductor 46 and second inductor 48 can be created to define different resonance frequencies.

Dual inductor circuit 40 may be included within an amplifier of a mixer in order to allow the mixer to handle two different frequency bands. First inductor 46 may set the gain of the first frequency band and second inductor 48 may set the gain of a second frequency band. Moreover, using testing and simulations, first inductor 46 can be tuned to account for parasitic effects of second inductor 48, and second inductor 48 can be tuned to account for parasitic effects of first inductor 46. Since first and second inductors 46 and 48 are isolated (not tapped from one another), these parasitic effects and feedback are significantly reduced relative to a tapped configuration like that shown in FIG. 4.

First inductor 46 may be used in a first mode of operation of a wireless communication device, and second inductor 48 may be used in a second mode of operation of the wireless communication device. The first mode of operation may be associated with a first frequency band below approximately 1.0 gigahertz (GHz) and the second mode may be associated with a second frequency band above approximately 1.0 GHz. By way of example, the first frequency band may be a legacy analog band around approximately 800 megahertz (MHz), and the second frequency band may be a band around approximately 2.4 GHz or 1.8 GHz. More generally, however, dual inductor circuit 40 could be tuned for any two frequency bands.

FIG. 6 is a circuit layout diagram providing another illustrative example of a dual inductor circuit 50 according to this disclosure. Dual inductor circuit 50 comprises a first inductor 56 and a second inductor 58. Both inductors 56 and 58 comprise coils that coil in a two-dimensional fashion. The two-dimensional layout of second inductor 58 is disposed inside the two-dimensional layout of first inductor 56. Dimensions of dual inductor circuit 50 are shown in FIG. 6. However, examples of this disclosure are not necessarily limited to the sizes or shapes of the coils shown in FIG. 6.

In many respects, dual inductor circuit 50 of FIG. 6 is similar to dual inductor circuit 40 of FIG. 5. In particular, in dual inductor circuit 50, first inductor 56 defines a first terminal 51 and a second terminal 52, and first inductor 56 coils from the first and second terminals 51 and 52 to a ground terminal 55. Second inductor 58 is disposed inside first inductor 56, but is independent from first inductor 56 and is not tapped from first inductor 56. In this manner, dual inductor circuit 50, like dual inductor circuit 40, is different from inductor circuit 30 of FIG. 4, which defines a tapped configuration.

In dual inductor circuit 50, second inductor 58 defines a third terminal 53 and a fourth terminal 54. Second inductor 58 coils from third and fourth terminals 53 and 54 to ground terminal 55. Third and fourth terminals 53 and 54 of the second inductor 58 are independent from the first inductor 56 insofar as third and fourth terminals 53 and 54 are not tapped from first inductor 56. This also allows first inductor 56 and second inductor 58 to be created to define different resonance frequencies, which is highly desirable as described above.

Dual inductor circuit 50 may be included within an amplifier of a mixer in order to allow the mixer to handle two different frequency bands. First inductor 56 may be tuned to a first frequency band and second inductor 58 may be tuned to a second frequency band. Moreover, using simulations and testing, first inductor 56 can be tuned to account for parasitic effects of second inductor 58, and second inductor 58 can be tuned to account for parasitic effects of first inductor 56.

Dual inductor circuit 50 further reduces parasitic effects relative to dual inductor circuit 40 due to more physical separation between first inductor 56 and second inductor 58 compared to that between first inductor 46 and second inductor 48 of dual inductor circuit 40. In particular, second inductor 58 may be separated from the first inductor 56 by greater than approximately 20 microns. This can help to even further reduce or eliminate electromagnetic interference and parasitic effects between inductors 56 and 58. A surface area associated with dual inductor circuit 50 defines less than approximately 0.3 square millimeters, although this disclosure is not necessarily limited in this respect.

First and second inductors 56 and 58 are not only separated by greater than 20 microns of space, but are isolated (not tapped from one another). As discussed above, this isolation is also very useful in reducing parasitic effects and electromagnetic coupling effects between inductor 56 and 58. In particular, physical isolation of inductors 56 and 58, in contrast to a tapped configuration, can significantly reduce parasitic capacitances and electromagnetic coupling between inductors 56 and 58. In addition, this isolation allows inductors 56 and 58 to define different resonance frequencies, which can avoid performance impacts for the different frequency bands handled by the different inductors.

First inductor 56 may be used in a first mode of operation of a wireless communication device, and second inductor 58 may be used in a second mode of operation of the wireless communication device. The first mode of operation may be associated with a first frequency band below approximately 1.0 GHz and the second mode may be associated with a second frequency band above approximately 1.0 GHz. As an illustrative example, the first frequency band may be a legacy analog band around approximately 800 megahertz (MHz), and the second frequency band may be a PCS band around approximately 2.4 GHz or 1.8 GHz. More generally, however, dual inductor circuit 50 could be tuned for any two frequency bands. As an example, first inductor 56 may coil over a distance of approximately 0.35 to 0.6 millimeters, and second inductor 58 may coil over a distance of approximately 0.2 to 0.32 millimeters.

Figure 7:
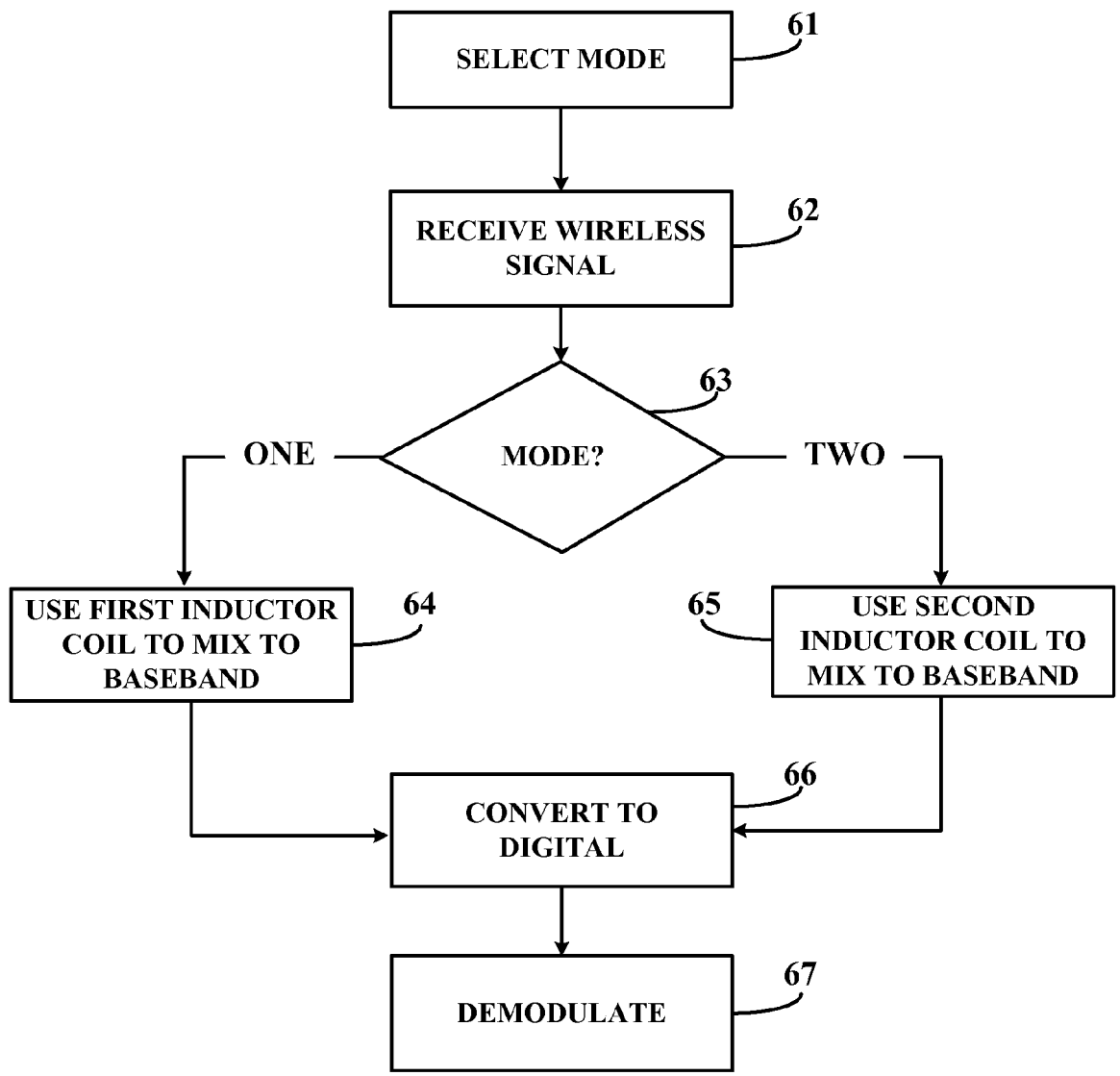
FIG. 7 is a flow diagram illustrating a method that may be executed by a wireless communication device implementing a dual inductor circuit as described herein.

FIG. 7 is a flow diagram illustrating a method that may be executed by a wireless communication device implementing a dual inductor circuit as described herein. The functionality of FIG. 7 will be described with reference to wireless communication device 10 of FIG. 1. As shown in FIG. 7, device 10 selects a mode of operation (61), such as a digital PCS mode that operates in a frequency band above 1.0 GHz, or an analog (or other mode) that operates in a frequency band below 1.0 GHz. Antenna 12 receives a wireless signal (62), which includes a baseband signal modulated onto a carrier wave. Depending on the mode of operation (63), inductor circuit 16 of mixer 15 selects either a first (outer) coil or a second (inner) coil.

In particular, following scaling by one of LNAs 14A or 14B, the received signal is passed to mixer 15. If device 10 is operating in a first mode of operation ("ONE" branch of 63), then mixer 15 uses a first inductor of inductor circuit 16 in the mixing process (64). Alternatively, if device 10 is operating in a second mode of operation ("TWO" branch of 63), then mixer 15 uses a second inductor of inductor circuit 16 in the mixing process (65). As described herein, the second inductor is disposed within the first inductor but includes independent terminals that are not tapped from the first inductor. A ground terminal may be shared by the first and second inductors. In this manner, mixer 15 can generate baseband signals for received signals associated with two different frequency bands.

The baseband signals can be converted to digital samples (66) via A/D converter 18 and a digital demodulation circuit 19 can perform demodulation (67) with respect to the digital baseband samples. Of course, the techniques of this disclosure can also work with purely analog signals, which would not be converted to digital samples, but would be demodulated in the analog domain. In other words, one or both of the modes of operation of device 10 could be a purely analog mode.

A number of examples have been described. The disclosed inductor-inside-inductor can be fabricated onto a radio frequency integrated circuit (RFIC), and may reduce the needed area and costs associated with such RFIC fabrication. Although described with reference to a mixer on an RFIC chip, the disclosed dual inductor circuit could be used in other devices. Also, the disclosed inductor could also be used in a mixer of an RF transmitter that mixes baseband signals onto a carrier. Accordingly, these and other examples are within the scope of the following claims.

The invention claimed is:

1. A multi-band wireless communication device comprising a mixer that mixes baseband signals from received signals, the mixer comprising a dual inductor circuit including:
   a first inductor defining a first terminal and a second terminal, wherein the first inductor coils from the first and second terminals to a ground terminal; and
   a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

2. The device of claim 1, wherein the third and fourth terminals of the second inductor are not tapped from the first inductor.

3. The device of claim 1, wherein the first inductor is tuned to a first frequency band and the second inductor is tuned to a second frequency band.

4. The device of claim 3, wherein the first inductor is tuned to account for parasitic effects of the second inductor and the second inductor is tuned to account for parasitic effects of the first inductor.

5. The device of claim 1, wherein the second inductor is separated from the first inductor by greater than approximately 20 microns.

6. The device of claim 1, wherein a surface area associated with the dual inductor circuit defines less than approximately 0.3 square millimeters.

7. The device of claim 1, wherein the device supports a first mode of operation in which the mixer implements the first inductor and a second mode of operation in which the mixer implements the second inductor.

8. The device of claim 7, wherein the first mode is associated with a first frequency band below approximately 1.0 gigahertz (GHz) and the second mode is associated with a second frequency band above approximately 1.0 GHz.

9. The device of claim 8, wherein the first frequency band is around approximately 800 megahertz (MHz) and the second frequency band is around approximately 2.4 GHz.

10. The device of claim 1, wherein the mixer generates baseband signals, the device further comprising:
    an analog-to-digital converter that converts the baseband signals to digital baseband samples; and
    a digital demodulation circuit that demodulates the digital baseband samples.

11. The device of claim 1, wherein the dual inductor circuit is included in an amplifier of the mixer.

12. The device of claim 1, wherein the first and second inductors have different resonance frequencies.

13. A method comprising mixing received wireless signals to baseband signals using a selected inductor of a dual inductor circuit in a wireless communication device, the dual inductor circuit including:
    a first inductor defining a first terminal and a second terminal, wherein the first inductor coils from the first and second terminals to a ground terminal; and
    a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

14. The method of claim 13, further comprising selecting between a first mode of operation in which a mixer implements the first inductor and a second mode of operation in which the mixer implements the second inductor.

15. The method of claim 14, wherein the first mode is associated with a first frequency band below 1.0 approximately gigahertz (GHz) and the second mode is associated with a second frequency band above approximately 1.0 GHz.

16. The method of claim 15, wherein the first frequency band is around approximately 800 megahertz (MHz) and the second frequency band is around approximately 2.4 GHz.

17. The method of claim 13, further comprising:
    converting the baseband signals to a digital baseband samples; and
    demodulating the digital baseband samples.

18. The method of claim 13, wherein the dual inductor circuit is included in an amplifier of a mixer of the wireless communication device.

19. The method of claim 13, wherein the third and fourth terminals of the second inductor are not tapped from the first inductor.

20. The method of claim 13, wherein the first inductor is tuned to a first frequency band and the second inductor is tuned to a second frequency band.

21. The method of claim 20, wherein the first inductor is tuned to account for parasitic effects of the second inductor and the second inductor is tuned to account for parasitic effects of the first inductor.

22. The method of claim 13, wherein the second inductor is separated from the first inductor by greater than approximately 20 microns.

23. The method of claim 13, wherein a surface area associated with the dual inductor circuit defines less than approximately 0.3 square millimeters.

24. The method of claim 13, wherein the first and second inductors have different resonance frequencies.

25. A multi-band wireless communication device comprising a mixer that mixes baseband signals onto a carrier, the mixer comprising a dual inductor circuit including:

a first inductor defining a first terminal and a second terminal, wherein the first inductor coils from the first and second terminals to a ground terminal; and a second inductor disposed inside the first inductor, the second inductor defining a third terminal and a fourth terminal, wherein the second inductor coils from the third and fourth terminals to the ground terminal, and wherein third and fourth terminals of the second inductor are independent from the first inductor.

* * * * *